United States Patent
Hao et al.

(10) Patent No.: US 12,388,272 B2
(45) Date of Patent: Aug. 12, 2025

(54) BALANCING OF BATTERY PACKS VIA DC-TO-DC CONVERTERS AND MOTOR INVERTER CIRCUITS

(71) Applicant: GM GLOBAL TECHNOLOGY OPERATIONS LLC, Detroit, MI (US)

(72) Inventors: Lei Hao, Troy, MI (US); Yue-Yun Wang, Troy, MI (US); Yongjie Zhu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 697 days.

(21) Appl. No.: 17/678,143

(22) Filed: Feb. 23, 2022

(65) Prior Publication Data

US 2023/0268745 A1  Aug. 24, 2023

(51) Int. Cl.
*H02J 7/00* (2006.01)
*G01R 31/3835* (2019.01)
*H02J 7/14* (2006.01)
*H02M 3/158* (2006.01)
*H02M 7/5387* (2007.01)
*H02P 27/08* (2006.01)

(52) U.S. Cl.
CPC ........ *H02J 7/0019* (2013.01); *G01R 31/3835* (2019.01); *H02J 7/0024* (2013.01); *H02J 7/0048* (2020.01); *H02J 7/0063* (2013.01); *H02J 7/007182* (2020.01); *H02J 7/1423* (2013.01); *H02M 3/158* (2013.01); *H02M 7/53871* (2013.01); *H02P 27/08* (2013.01); *H02J 2207/20* (2020.01)

(58) Field of Classification Search
USPC ........................................................ 320/117
See application file for complete search history.

(56) References Cited

U.S. PATENT DOCUMENTS

| | | | | |
|---|---|---|---|---|
| 5,883,496 A | * | 3/1999 | Esaki ...................... | B60L 58/20 320/132 |
| 7,256,516 B2 | * | 8/2007 | Buchanan .......... | H01M 10/441 307/62 |
| 10,675,991 B2 | | 6/2020 | Hu et al. | |
| 11,133,680 B2 | | 9/2021 | Wang et al. | |
| 2008/0284384 A1 | * | 11/2008 | Kato ..................... | H02J 7/1446 322/17 |
| 2010/0321025 A1 | * | 12/2010 | Lin ................... | H01M 10/4207 324/427 |

(Continued)

*Primary Examiner* — Samuel Berhanu

(57) ABSTRACT

A charging system includes: a charge port that receives shore power; a DC-to-DC converter or a motor inverter circuit; switches that connect the charge port and the DC-to-DC converter or the motor inverter circuit to battery packs; and a control module. The control module: determines open circuit voltages or states of charges of the battery packs; based on the open circuit voltages or the states of charges of the battery packs, determines whether to connect at least one of the battery packs to the charge port, the DC-to-DC converter, and the motor inverter circuit; and based on the determination of whether to connect at least one of the battery packs, control states of the switches to charge the at least one of the battery packs by selectively connecting the at least one of the battery packs to (a) the charge port, or (b) the DC-to-DC converter or motor inverter circuit.

21 Claims, 9 Drawing Sheets

(56) References Cited

U.S. PATENT DOCUMENTS

2016/0193932 A1* 7/2016 Vaghefinazari ....... H02J 7/0029
        320/109
2016/0380315 A1* 12/2016 Weicker ................ H02J 7/1423
        320/136
2020/0108733 A1* 4/2020 Oguma ................. B60W 10/08

* cited by examiner

BALANCING OF BATTERY PACKS VIA DC-TO-DC CONVERTERS AND MOTOR INVERTER CIRCUITS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to power sources for electric vehicles.

Electric vehicles include one or more power sources for supplying electrical energy to one or more electric motors. The electric motors are utilized for propulsion purposes and can also be used to reduce speed of the vehicles and recharge, for example, cells of the power sources. As an example, the electric motors may be operated as generators during regenerative braking operation to decelerate the vehicles and/or recharge the power sources.

SUMMARY

A charging system is disclosed and includes: one or more charge ports configured to receive shore power; at least one of a direct current (DC)-to-DC converter or a motor inverter circuit; switches configured to connect the one or more charge ports and the at least one of the DC-to-DC converter or the motor inverter circuit to battery packs; and a control module configured to (i) determine at least one of open circuit voltages or states of charges of the battery packs, (ii) based on the at least one of the open circuit voltages or the states of charges of the battery packs, determine whether to connect at least one of the battery packs to the one or more charge ports, the DC-to-DC converter, and the motor inverter circuit, and (iii) based on the determination of whether to connect the at least one of the battery packs, control states of the switches to charge the at least one of the battery packs by selectively connecting the at least one of the battery packs to at least one of (a) the one or more charge ports, or (b) the at least one of the DC-to-DC converter or the motor inverter circuit.

In other features, the charging system further includes sensors configured to detect the open circuit voltages of the battery packs.

In other features, the switches are configured to connect the one or more charge ports to the battery packs. The control module is configured to, based on the at least one of the open circuit voltages or the states of charges of the battery packs, control the states of the switches to charge at least one of the battery packs by selectively connecting the at least one of the battery packs to the one or more charge ports.

In other features, the charging system includes the DC-to-DC converter. The switches are configured to connect the one or more charge ports and the DC-to-DC converter to the battery packs. The control module is configured, based on the at least one of the open circuit voltages or the states of charges of the battery packs, to control the states of the switches to charge the at least one of the battery packs by selectively connecting the at least one of the battery packs to the DC-to-DC converter.

In other features, the control module is configured to control the states of the switches to charge a selected one or more of the battery packs via the one or more charge ports and the DC-to-DC converter.

In other features, the switches are configured to connect the motor inverter circuit to the battery packs. The control module is configured to, based on the at least one of the open circuit voltages or the states of charges of the battery packs, control the states of the switches to charge at least one of the battery packs by selectively connecting the at least one of the battery packs to the motor inverter circuit.

In other features, the control module is configured to control the states of the switches to charge a selected one or more of the battery packs via the one or more charge ports and the motor inverter circuit.

In other features, the motor inverter circuit includes: an inverter; and a motor configured to receive power from the battery packs or the one or more charge ports via the inverter.

In other features, the control module is configured to: control the states of the switches to connect (i) the battery packs in series and to terminals of the one or more charge ports; and change the states of the switches to connect the one or more charge ports to an input of the DC-to-DC converter, and (ii) an output of the DC-to-DC converter to one or more of the battery packs.

In other features, the battery packs include a first battery pack and a second battery pack. The control module is configured to control the states of the switches to (i) connect the first battery pack to an input of the DC-to-DC converter, and (ii) an output of the DC-to-DC converter to the second battery pack to perform charge balancing via the DC-to-DC converter.

In other features, the one or more charge ports include charge ports. Each of the charge ports are configured to be connected to each of the battery packs based on states of the switches. The control module is configured to independently charge each of the battery packs with one or more of the charge ports.

In other features, the control module is configured to: control the states of the switches to series charge the battery packs; and subsequent to series charging the battery packs, cease charging of a first one of the battery packs and continue charging of a second one of the battery packs until an open circuit voltage of the second one of the battery packs is within a predetermined range of an open circuit voltage of the first one of the battery packs.

In other features, the charging of the second one of the battery packs is performed via the at least one of the DC-to-DC converter or the motor inverter circuit.

In other features, subsequent to charging the second one of the battery packs, the control module is configured to control states of the switches to connect the battery packs in parallel.

In other features, the control module is configured to calculate an open circuit voltage of one of the battery packs based on open circuit voltages of modules of the one of the battery packs.

In other features, the control module is configured to subsequent to series charging the battery packs, determine a first one of the battery packs has a lower capacity and a higher open circuit voltage than a second one of the battery packs, and charge the second one of the battery packs via the first one of the battery packs.

In other features, the charging of the second one of the battery packs is performed via the at least one of the DC-to-DC converter or the motor inverter circuit.

In other features, the control module is configured, subsequent to the charging of at least one of the battery packs, to at least one of: control the states of the switches to (i) connect the battery packs in parallel and to an input of the DC-to-DC converter, and (ii) connect an output of the DC-to-DC converter to a load; or control the states of the switches to connect the battery packs in parallel and to an input of the motor inverter circuit to drive a motor of the motor inverter circuit.

In other features, a charging system is disclosed and includes: one or more charge ports configured to receive shore power; a direct current (DC)-to-DC converter; switches configured to connect the one or more charge ports and the DC-to-DC converter to battery packs; and a control module configured to (i) control states of the switches to series charge the battery packs, (ii) subsequent to series charging the battery packs, determine at least one of open circuit voltages or states of charges of the battery packs, and (iii) based on the at least one of the open circuit voltages or the states of charges of the battery packs, charge one of the battery packs by selectively connecting the one of the battery packs to the DC-to-DC converter and (a) another one of the battery packs, or (b) the one or more charge ports.

In other features, a charging system is disclosed and includes: one or more charge ports configured to receive shore power; a motor inverter circuit; switches configured to connect the one or more charge ports and the motor inverter circuit to battery packs; and a control module configured to (i) control states of the switches to series charge the battery packs, (ii) subsequent to series charging the battery packs, determine at least one of open circuit voltages or states of charges of the battery packs, and (iii) based on the at least one of the open circuit voltages or the states of charges of the battery packs, charge one of the battery packs by selectively connecting the one of the battery packs to the motor inverter circuit and (a) another one of the battery packs, or (b) the one or more charge ports.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Series and parallel battery configurations are implemented in electric vehicles. Battery packs, which may include battery modules with hundreds of battery cells, can become imbalanced. This imbalance may occur after charging of the battery packs is completed. As an example, two battery packs may be connected in series to receive a high voltage (e.g., 800 Volts (V)) and, when series charging is completed, may be connected in parallel to supply a lower voltage (e.g., 400 V) to direct current (DC) loads. As another example, two battery packs may be disconnected and independently charged, when charging is completed, two pack may be connected in parallel to supply a voltage to DC loads. After charging of the two battery packs, the SOCs of the batteries may be imbalanced. For example, one battery pack may have 5% more SOC than the other battery pack. The battery pack with the higher SOC can be the battery pack with a smaller capacity due to aging. This can cause an in-rush of current from the battery pack with the higher SOC to the battery pack with the lower SOC. This can reduce life of the battery pack with the lower capacity and can also reduce life of contactors (or switches) implemented in a charging circuit and reduce available power.

Figure 1A:
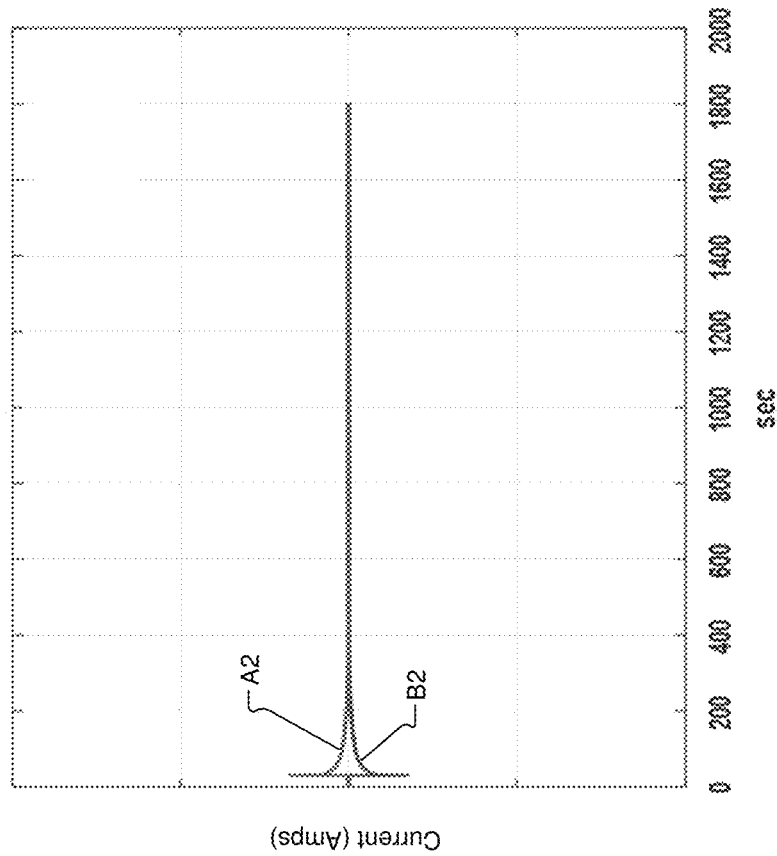
FIG. 1A is an example plot of in-rush current versus time for battery packs having a 5% state of charge (SOC) imbalance.
Figure 1B:
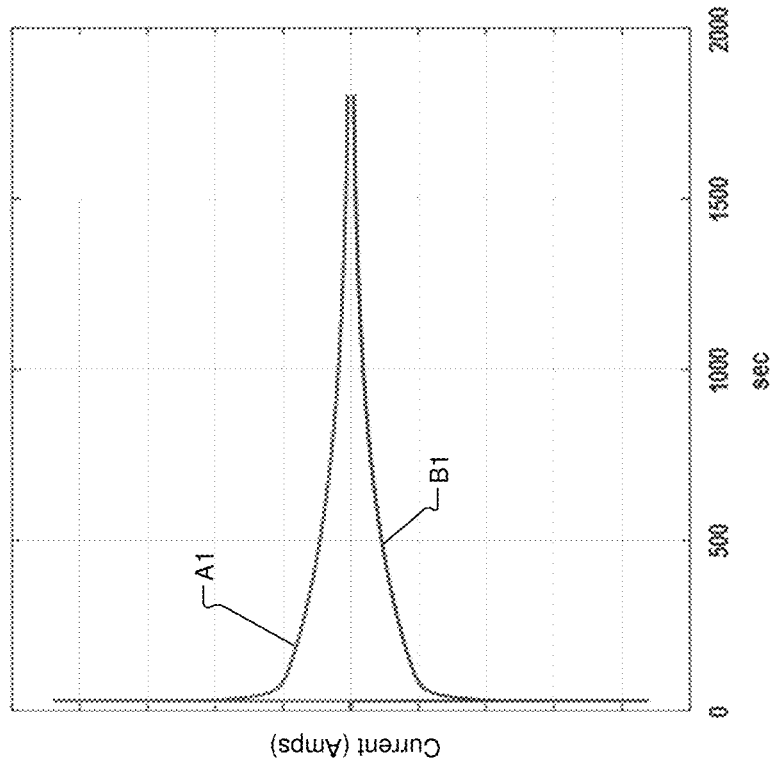
FIG. 1B is an example plot of in-rush current versus time for battery packs having 1% SOC imbalance.

FIG. 1A shows an example plot of in-rush current versus time for battery packs A and B having a 5% SOC) imbalance between them. Battery pack A may be at 95% SOC and battery pack B may be at 90% SOC. When connected in parallel, there is an in-rush of current from battery pack A to battery pack B. Current flowing through battery pack A is in an opposite direction than current flowing through battery back B. The in-rush of current is shown by the initial spikes in magnitudes of current in the curves A1, B1. FIG. 1B shows another example plot of in-rush current versus time for battery packs A, B having a 1% SOC imbalance between them. The y-axis scale of FIG. 1B may be the same as the y-axis scale of FIG. 1A. As shown by curves A2, B2, the amount of in-rush current is substantially less, when the amount of imbalance is less.

The examples set forth herein include charging circuits for balancing SOCs across multiple battery packs. The examples include charging circuits and methods to charge battery packs and balance VOCs and SOCs of the battery packs using charge ports, DC-to-DC converters, motor inverter circuits, and switch circuits. The balancing may occur after high-voltage (e.g., 800V) port charging via a charging station (referred to as shore power). As a result, the in-rush current is greatly reduced while two packs are connected in parallel.

In one embodiment, after charging via a charging station is completed, in which case the battery packs of a power source may be connected in series, a drive system is used to charge a battery pack having a low VOC and/or SOC as compared to another battery pack. This charging balances the VOC and SOC of the battery packs prior to the battery packs being connected in parallel. The balancing of VOCs refers to reducing a difference between the VOCs of the battery packs. The balancing of the SOCs refers to reducing a difference between the SOCs of the battery packs. Multiple charging configurations are disclosed that include a DC-to-DC converter or a drive system for battery pack charging. The drive system includes a motor and an inverter, which are collectively referred to herein as a motor inverter circuit.

In some embodiments, one or more charging ports are used to charge battery packs. One or more ports may be used to selectively charge a "weak" battery pack (or battery pack) having a lower VOC and/or lower SOC than another (or "strong") battery pack. The strong battery pack may be used to charge the weak battery pack.

The VOCs and SOCs of battery packs may be monitored by a vehicle integration control module (herein after referred to as the vehicle control module) and/or a battery management module (BMM). The BMM may be a distributed wireless BMM (DWBMM), which may be implemented in a distributed wireless battery management system (DWBMS). In one embodiment, when the SOCs are monitored by the DWBMM, the DWBMM calculates the VOCs based on measured open circuit voltages (VOCMs) of battery modules within the battery packs, as further described below. In one embodiment, after a battery pack has aged and is now a weak battery pack, series charging of the battery packs is controlled based on the weak battery pack, as further described below. This is done such that the VOCs and SOCs are able to be balanced.

Figure 2:
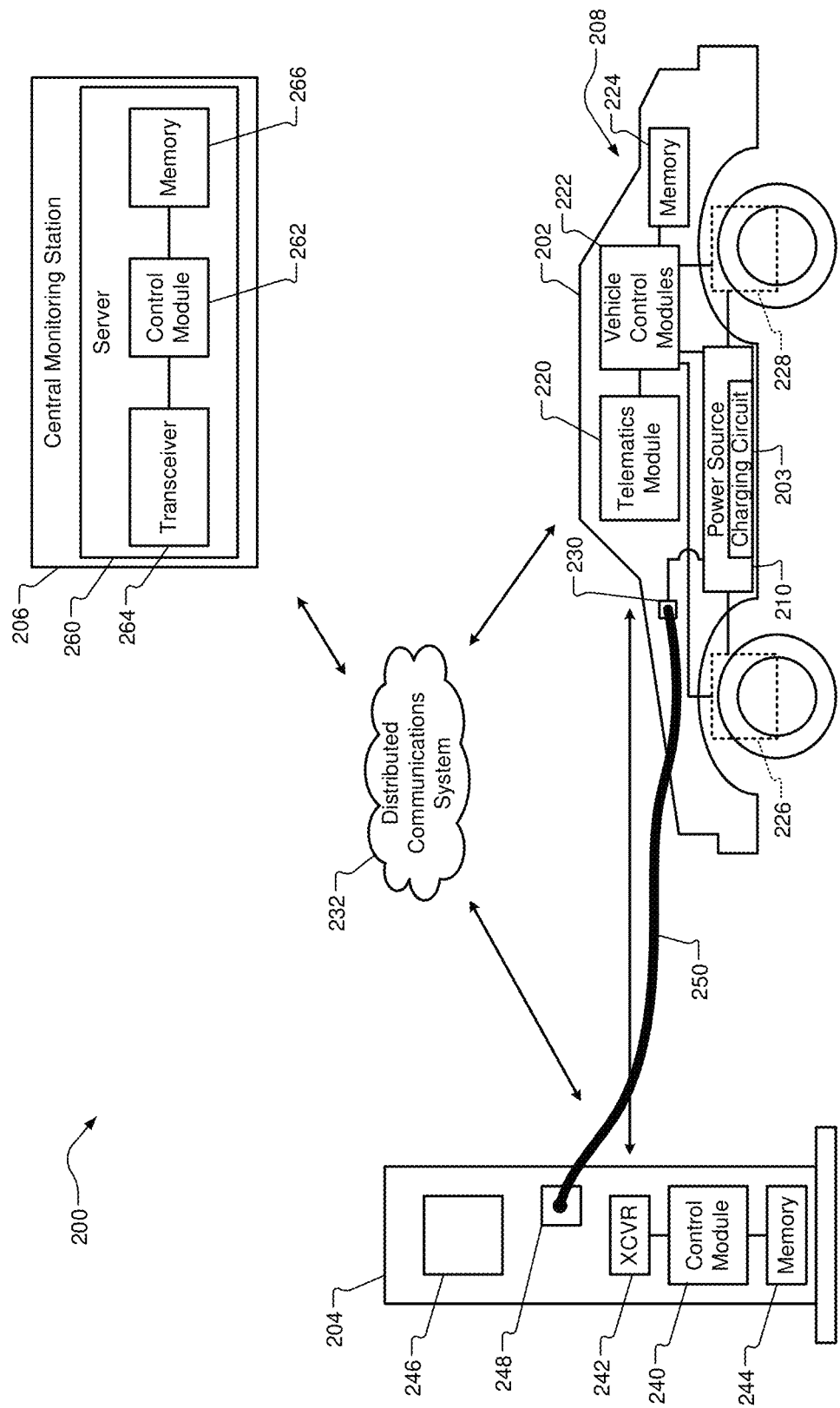
FIG. 2 is a functional block diagram of an example of a charging system including a vehicle with a charging circuit in accordance with the present disclosure.

FIG. 2 shows a charging system 200 including a vehicle 202 with a charging circuit 203. The charging circuit 203 may be implemented as shown, for example, in FIGS. 3-7 and/or as described below. Although different embodiments are shown in FIGS. 3-7, features of multiple embodiments may be combined. For example, one or more features of the embodiments of FIGS. 4-6 may be combined with one or more features of FIG. 7. For example, charging and/or charge balancing may be provided via a DC-to-DC converter and/or a motor inverter circuit. The DC-to-DC circuits disclosed herein may be used for charging, charge balancing and/or for supplying power to one or more DC loads within the vehicle 202, such as lights, displays, controllers, motors, fans, etc.

The charging system 200 further includes a charging station 204 and a central monitoring station 206. The vehicle 202 includes a propulsion system 208 having a power source 210 (hereinafter power source 210) including the charging circuit 203. The power source 210 may be dynamically adjustable to receive different maximum output voltages, current levels and/or power levels from different types of charging stations. In an embodiment, the power source 210 is configured to receive voltages within a particular voltage range.

The propulsion system 208 further includes a telematics module 220, vehicle control modules 222, a memory 224, motors 226, 228 and a charging connector 230. The telematics module 220 may include transceivers and communicate with the charging station 204, the central monitoring station 206 and/or other infrastructure device. This communication may occur via a distributed communications system 232. The telematics module 220 may communicate with infrastructure devices according to Wi-Fi, Bluetooth and/or wireless local area network, wide area network, and/or other communication protocols. The vehicle control modules 222 may include a body control module, a propulsion control module, a battery management module, etc. Although two motors are shown, any number of motors may be included. The motors 226, 228 may be controlled by one or more of the vehicle control modules.

The power source 210 may include any number of cells, battery packs, and/or power modules, which may be dynamically connected in various series and/or parallel arrangements to be compatible with different types of charging stations. The battery packs and/or modules within the battery packs may each include the same number of cells connected in a same arrangement, such that each battery pack has a same output voltage rating and output current rating. The cells, battery packs, and/or power modules may also be dynamically connected in various series and/or parallel arrangements to accommodate different speed, acceleration and torque requests and/or operating modes. The power source 210 may be configured for: various voltage levels, such as maximum output voltages of 400V, 800V, and 1600V and/or nominal output voltages of 375V, 750V, and 1500V; and various power levels, such as maximum output power levels of 150 kW, 350 kW and 900 kW. The power source 210 may also be configured to command different maximum charging current levels, if needed, such as 200 A, 400 A, 500 A and 600 A depending on the state of charge and charge rate of the power source 210.

The power source 210 may be dynamically configurable to connect to different charging stations and to be charged at maximum voltage levels of the different charging stations or configured for particular type of charging station having a particular maximum voltage range. The power source 210 may include nominal low voltage energy storage devices (or battery packs), which are configurable for high voltage and high-power direct current (DC) charging.

The propulsion system 208 may be configured to communicate with the charging stations, remote devices, and/or other infrastructure devices to determine capabilities of the charging stations and then dynamically be configured to be charged at maximum voltage levels of the charging stations. The propulsion system 208 may perform switch sequencing for transitioning switches to appropriate states to match the battery voltage of the vehicle to a maximum voltage of the currently connected charging station. As a result, the propulsion system 208 may be forward compatible for charging stations with maximum charging voltages higher than the native voltage of the vehicle (e.g., voltages greater than 800V for an 800V vehicle electric system) and backwards compatible for charging stations with maximum charging voltages lower than the native voltage of the vehicle (e.g., less than or equal to 800V for an 800V vehicle electric system).

The charging station 204 may include a control module 240, a transceiver 242, a memory 244, a display 246 and a charging connector 248. The charging station 204 communicates with the vehicle 202 via the transceiver 242. An electrical power line 250 is connected from the charging connector 248 to the charging connector 230 while charging the power source 210. In one embodiment, the control module 240 communicates with, for example, a battery management module of the vehicle 202 to indicate to the battery management module, charging capabilities (e.g., maximum output voltage and current levels) of the charging station 204. The charging station 204 may receive utility power and supply power at a predetermined voltage level to the vehicle 202 and/or the power source 210. Prior to charging, the power source 210 is configured to be charged at the maximum output voltage level of the charging station 204. The charging station 204 may be located in a residential building, at a business, at a roadside recharging station, at a public facility, and/or elsewhere.

The charging station 204 may have a maximum output voltage rating of 400 volts (V), 800V or 1600V and have a nominal output voltage of, for example, 375V, 750V, or 1500V. The charging station 204 may have maximum output power ratings of 150 kilowatts (kW), 350 kW or 900 kW. A 1500V charging station may have a maximum output current rating of 600 amperes (A). The stated voltages, power levels, and current level are provided as examples only. The charging station 204 may have other voltage current and/or power ratings and outputs.

The central monitoring station 206 may be located at a charging center along with the charging station 204 or may be located elsewhere. The central monitoring station 206 may be a service provider station, a central power station, or manufacturer monitoring station. The central monitoring station 206 may include a server 260, which may in turn include a control module 262, a transceiver 264 and memory 266. The control module 262 may collect charging station capability information including maximum charging voltage and current levels and indicate the capabilities to vehicles, such as the vehicle 202. The battery management module may then configure the power source 210 based on the capabilities of the charging station 204.

Figure 3:
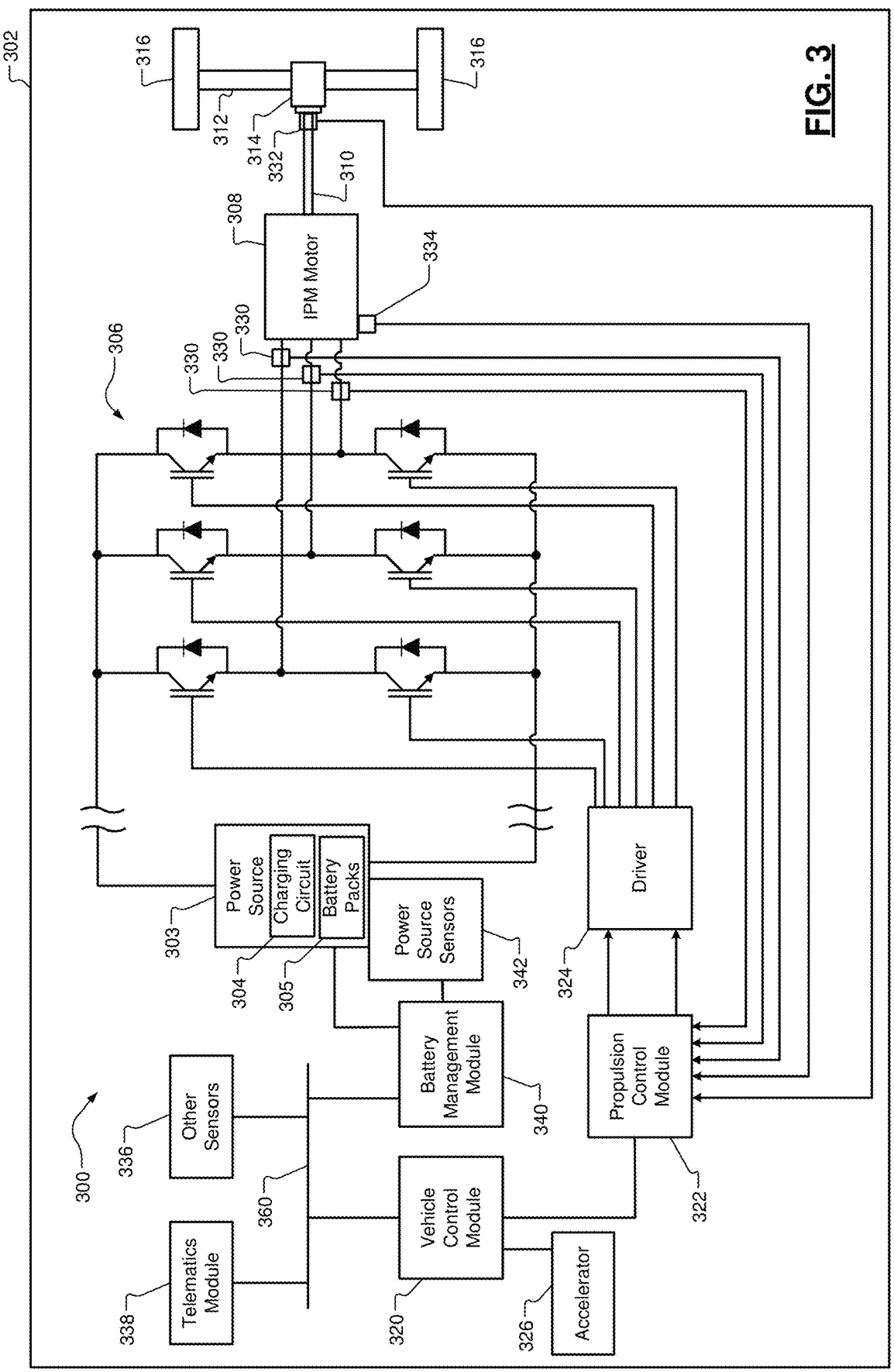
FIG. 3 is a functional block diagram of an example of a propulsion system including a power source with a charging circuit in accordance with the present disclosure.

FIG. 3 shows a propulsion system 300 of a vehicle 302 that including a power source 303 including a charging circuit 304 and battery packs 305. The charging circuit 304 may be implemented as any of the charging circuits disclosed herein. The battery packs 305 may include any number of battery packs, such as the battery packs shown in FIGS. 4-7.

The power source 303 may supply power to an inverter 306, which in turn drives a motor 308 (e.g., an interior permanent magnet (IPM) motor). Although the motor 308 is shown as an IPM motor, the motor 308 may be a surface permanent magnet motor or other type of electric motor. Although various examples are disclosed herein with respect to a motor, the examples are applicable to other electric machines.

The power source 303 may include multiple cells and/or battery packs that are connected in series and/or in parallel to provide a predetermined voltage output. The cells and/or battery packs can be in a fixed configuration to be compatible with a particular type of charging station.

The propulsion system 300 is used to move the vehicle 302 and further includes a shaft 310, an axle 312 including a differential 314 and wheels 316. The inverter 306 converts a DC voltage to a three-phase alternating current (AC) to power the motor 308. The motor 308 rotates the shaft 310, which in turn rotates the axle 312 via the differential 314.

The propulsion system 300 further includes a vehicle control module 320, a propulsion control module 322 and a driver 324. The vehicle control module 320 may generate a torque request signal. The torque request signal may be generated based on torque commanded, for example, by an accelerator 326 if included. The propulsion control module 322 may control the driver 324 based on the torque request signal. The driver 324 may, for example, generate pulse width modulation (PWM) signals to control states of transistors of the invertor 306 based on output of the propulsion control module 322.

The propulsion control module 322 controls the driver 324 based on outputs from sensors. The sensors may include current sensors (e.g., Hall Effect sensors 330), a resolver 332, a temperature sensor 334, and/or other sensors 336 (e.g., an accelerometer). The current sensors may include sensors other than Hall Effect sensors.

The propulsion control module 322 performs a transformation of current phase signals Ia, Ib and Ic for the three phases of the motor to current vector signals Id and Iq. The propulsion control module 322 determines how much current is flowing and how much current is needed (or requested) and modifies input current levels of the motor 308 by adjusting output current vector voltage signals supplied to the driver 324. This is based on (i) the current vector signals Id, Iq, (ii) the position signal out of the resolver 332, and (iv) the torque request signal from the vehicle control module 320.

A propulsion system 300 may include one or more electric motors. Each electric motor may be used to drive one or more axles and/or one or more wheels of the vehicle 302. As an example, an electric motor may be used to drive an axle of the vehicle 302 via a differential. The vehicle control module 320, based on a torque request, may signal the electric motor to rotate an input gear of the differential and as a result, the wheels attached to the axle. The vehicle control module 320 may adjust current, voltage and/or power levels of the electric motor to control acceleration, deceleration and/or speed of the vehicle 302.

The propulsion system 300 further includes a telematics module 338, a battery management module 340 and power source sensors and/or status monitoring devices (referred to as power source sensors 342). The battery management module 340 may configure the power source 303 as further described below based on output of the above-stated sensors, speed requests, current traveling speed, torque requests, charge states of battery packs of the power source 303, etc. The power source sensors 342 may include voltage sensors, current sensors, and/or other circuit elements used to monitor VOCs, SOCs and/or capacities of the battery packs 305 and/or cells and/or modules of the battery packs 305. The power source sensors 342 may be separate from the battery packs 305 or included in the battery packs 305 and monitor voltages, current levels, SOCs, VOCs, capacities, etc. of cells and/or modules of the battery packs and/or each of the battery packs 305 as a whole unit. The battery management module 340 may isolate one or more cells and/or battery packs 305 when: operating inappropriately; not charging to a predetermined voltage level; outputting a voltage and/or an amount of current at level(s) below predetermined minimum level(s); and/or exhibiting another abnormality. The modules 320, 338, 340, and sensors 336 may be connected and/or communicate with each other via a network 360 or other form of communication.

Figure 4:
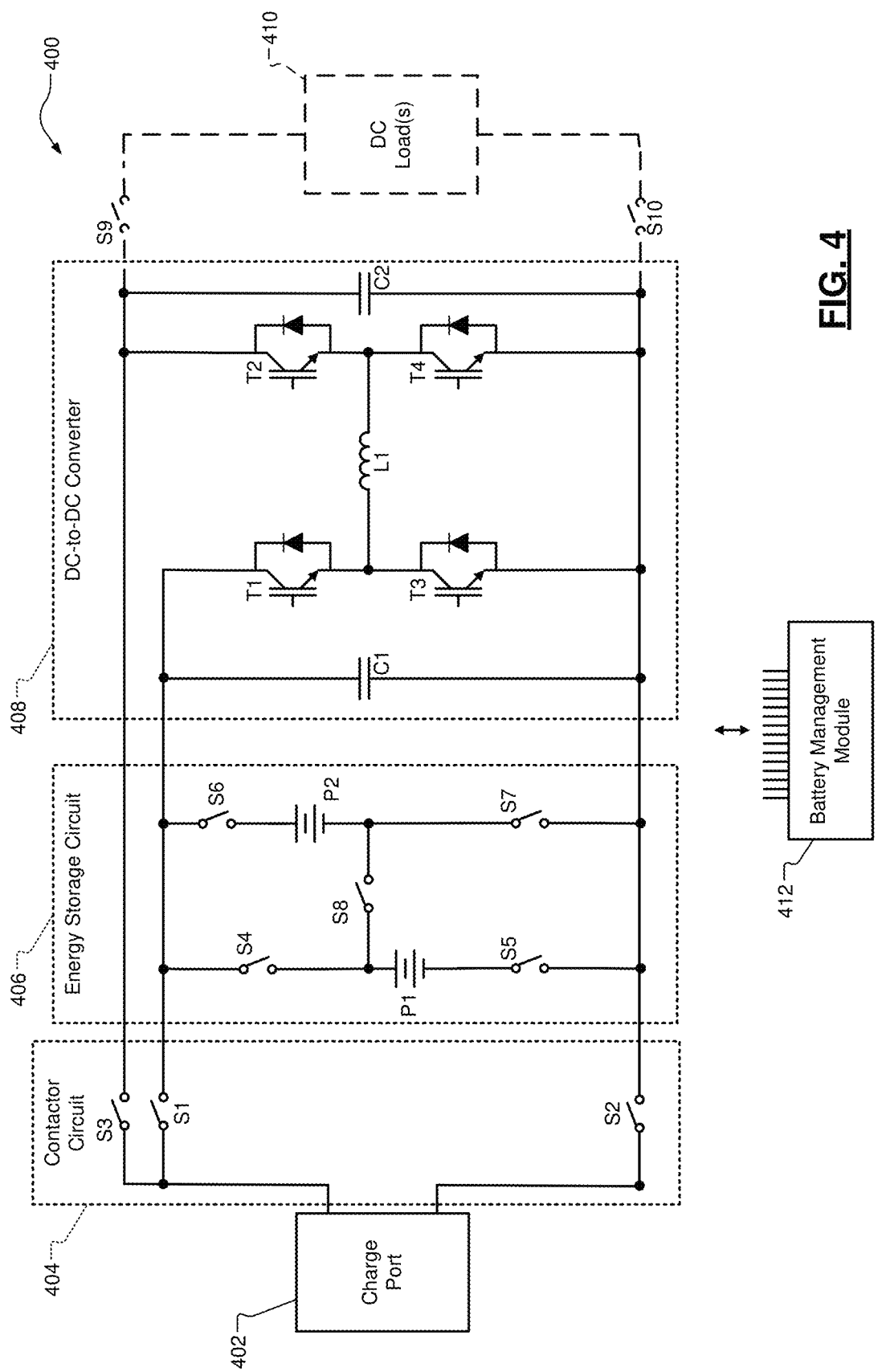
FIG. 4 is a schematic functional block diagram of a charging circuit configured for charge balancing via charge port and a DC-to-DC converter in accordance with the present disclosure.

FIG. 4 shows a charging circuit 400 including charging port and DC-to-DC charging and/or charge balancing. The charging circuit 400 includes a charge port 402, a contactor circuit 404, an energy storage circuit 406, and a DC-to-DC converter 408, which may be connected to one or more DC loads 410. The charge port 402 may be connected to a charging station, such as the charging station 204 of FIG. 2.

The contactor circuit 404 may include switches S1-S3, where S2 is optional. The switches S1 and S3 have first terminals connected to a first terminal of the charge port 402. The switch S2 has a first terminal connected to a second terminal of the charge port 402.

The energy storage circuit 406 may include switches S4-S8 and battery packs P1 and P2. The switches S4 and S5 and the battery pack P1 are connected in series. The switches S6 and S7 and the battery pack P2 are connected in series. The switches S4 and S6 are connected to a second terminal of the switch S1. The switches S5 and S7 are connected to a second terminal of the switch S2. The switch S8 has a first terminal connected to the switch S4 and the battery pack P1. The switch S8 has a second terminal connected to the battery pack P2 and the switch S7.

The DC-to-DC converter 408 may include a capacitor C1 and a capacitor C2, transistor-diode pairs T1-T4, and an inductor L1. The capacitor C1 is connected in parallel with the series combination of the switches S6, S7 and the battery pack P2. The transistor-diode pairs T1, T3 are connected in series and collectively in parallel with the capacitor C1. The transistor-diode pairs T2, T4 are connected in series and collectively in parallel with the capacitor C2. The transistor-diode pair T1 is connected to the second terminal of switch S1 and first terminals of switches S4 and S6. The transistor-diode pair T2 is connected to a second terminal of the switch S3. The transistor-diode pairs T3 and T4 are connected to the second terminals of the switches S2, S5 and S7. A first terminal of the inductor L1 is connected to the transistor-diode pairs T1, T3. The second terminal of the inductor L1 is connected to the transistor-diode pairs T2, T4. The DC-to-DC converter 408 is bidirectional. In a first direction, terminals of the capacitor C1 and transistor-diode pairs T1, T3 operate as inputs and terminals of the capacitor C2 and transistor-diode pairs T2, T4 operate as outputs. In a second direction, terminals of the capacitor C1 and transistor-diode pairs T1, T3 operate as outputs and terminals of the capacitor C2 and the transistor-diode pairs T2, T4 operate as inputs.

The DC loads 410 may be connected in parallel via switches S9, S10 to the series combination of the transistor-diode pairs T2, T4. The battery management module 412 or other control module disclosed herein may control states of the switches S1-S10 and the transistors of the transistor-diode pairs T1-T4, as described herein.

During operation, the battery packs P1 and P2 may be connected in series and the series combination thereof may be connected in parallel with the terminals of the charge port 402. For example, switches S1, S2, S5, S6 and S8 may be closed and switches S3, S4 and S7 may be open. Switches S9 and S10 may be open during this period. This is referred to as "series charging". After series charging is completed, the DC-to-DC converter 408 may be used to charge the one of the battery packs P1, P2 that has the lowest SOC and/or VOC. This may be referred to as "isolated charging". For example, if battery pack P1 has the lowest VOC, then switches S1, S2, S6, S7 and S8 are open and switches S3, S4 and S5 are closed. This allows the charge port 402 to charge battery pack P1 via the DC-to-DC converter 408. Switches S9 and S10 may be open during this period. When the VOCs of the battery packs were within a predetermined range of each other, isolated charging is complete. After isolated charging, switches S1, S2, S3 and S8 are open and switches S4, S5, S6, S7, S9 and S10 are closed, such that the battery packs P1, P2 are connected in parallel and supplying power to the DC-to-DC converter 408, which is supplying power to the DC loads 410.

The battery management module 412 may control duty cycles and/or frequencies of pulse width modulated (PWM) signals supplied to the transistors of the transistor-diode pairs T1-T4. The duty cycles and frequencies may be adjusted to adjust the output voltage of the DC-to-DC converter 408. For example, the duty cycles and/or frequencies are different when outputting a high voltage as compared to outputting a low voltage. This control may be provided based on monitored SOC, VOC and/or capacity states of the battery packs P1 and P2.

Figure 5:
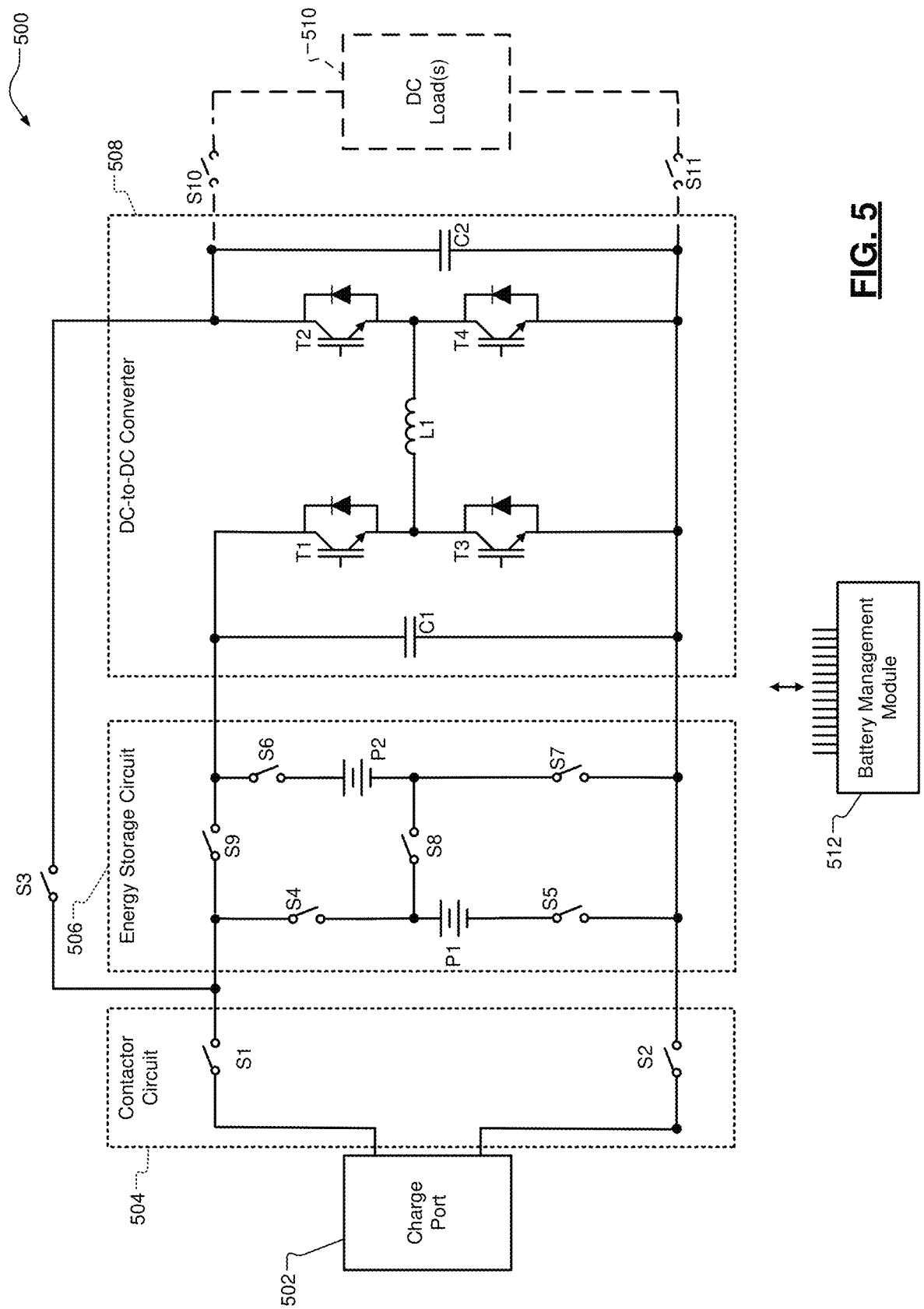
FIG. 5 is a schematic functional block diagram of a charging circuit configured for charge balancing between battery packs via a DC-to-DC converter in accordance with the present disclosure.

FIG. 5 shows a charging circuit 500 configured for charge balancing between battery packs via a DC-to-DC converter. The charging circuit 500 includes a charge port 502, a contactor circuit 504, an energy storage circuit 506, and a DC-to-DC converter 508, which may be connected to one or more DC loads 510. The charge port 502 may be connected to a charging station, such as the charging station 204 of FIG. 2. The contactor circuit 504 may include switches S1, S2. The switches S1 and S2 have first terminals connected respectively to terminals of the charge port 502.

The energy storage circuit 506 may include switches S4-S9 and battery packs P1 and P2. The switches S4 and S5 and the battery pack P1 are connected in series. The switches S6 and S7 and the battery pack P2 are connected in series. The switches S4 and S6 are connected to a second terminal of the switch S1. The switches S5 and S7 are connected to a second terminal of the switch S2. The switch S8 has a first terminal connected to the switch S4 and the battery pack P1. The switch S8 has a second terminal connected to the battery pack P2 and the switch S7. The switch S9 has a first terminal connected to the second terminal of the switch S1 and first terminals of the switches S3 and S4. The switch S9 has a second terminal connected to a first terminal of the switch S6.

The DC-to-DC converter 508 may include capacitors C1 and C2, transistor-diode pairs T1-T4, and an inductor L1. The capacitor C1 is connected in parallel with the series combination of the switches S6, S7 and the battery pack P2. The transistor-diode pairs T1, T3 are connected in series and collectively in parallel with the capacitor C1. The transistor-diode pairs T2, T4 are connected in series and collectively in parallel with the capacitor C2. The transistor-diode pair T1 is connected to the second terminal of switch S9 and a first terminal of switch S6. The transistor-diode pair T2 is connected to a second terminal of the switch S3. The transistor-diode pair T3 is connected to the second terminals of the switches S2, S5 and S7. The transistor-diode pair T4 is connected to second terminals of the switches S2, S5, S7. A first terminal of the inductor L1 is connected to the transistor-diode pairs T1, T3. The second terminal of the inductor L1 is connected to the transistor-diode pairs T2, T4. The DC-to-DC converter 508 is bidirectional. In a first direction, terminals of the capacitor C1 and transistor-diode pairs T1, T3 operate as inputs and terminals of the capacitor C2 and transistor-diode pairs T2, T4 operate as outputs. In a second direction, terminals of the capacitor C1 and transistor-diode pairs T1, T3 operate as outputs and terminals of the capacitor C2 and transistor-diode pairs T2, T4 operate as inputs.

The DC loads 510 may be connected in parallel via switches S10, S11 to the series combination of the transistor-diode pairs T2, T4. The battery management module 512 or other control module disclosed herein may control states of the switches S1-S11 and the transistors of the transistor-diode pairs T1-T4, as described herein.

During operation, the battery packs P1 and P2 may be connected in series and the series combination thereof may be connected in parallel with the terminals of the charge port 402. For example, switches S1, S2, S5, S6, S8 and S9 may be closed and switches S3, S4 and S7 may be open. Switches S10 and S11 may be open during this period. After series charging is completed, the DC-to-DC converter 508 may be used to charge balance the battery packs P1, P2. The battery pack that has the lowest SOC and/or VOC may be charged by the other battery pack. For example, switches S1, S2, S8 and S9 are open and switches S3, S4, S5, S6 and S7 are closed. This disconnects the charge port and connects the first battery pack P1 to the transistor-diode pairs T2, T4 and the second battery pack P2 to the transistor-diode pairs T1 and T3.

The battery management module 512 may control duty cycles and/or frequencies of pulse width modulated (PWM) signals supplied to the transistors of the transistor-diode pairs T1-T4. The duty cycles and frequencies may be adjusted to adjust the output voltage of the DC-to-DC converter 508. This control may be provided based on monitored SOC, VOC and/or capacity states of the battery packs P1 and P2.

When the VOCs of the battery packs P1, P2 are within a predetermined range of each other, charge balancing is complete. After charge balancing, switches S1, S2, S3 and S8 are open and switches S4, S5, S6, S7, S9, S10 and S11 are closed, such that the battery packs P1 and P2 are connected in parallel and supplying power to the DC-to-DC converter 508, which is supplying power to the DC loads 510.

Figure 6:
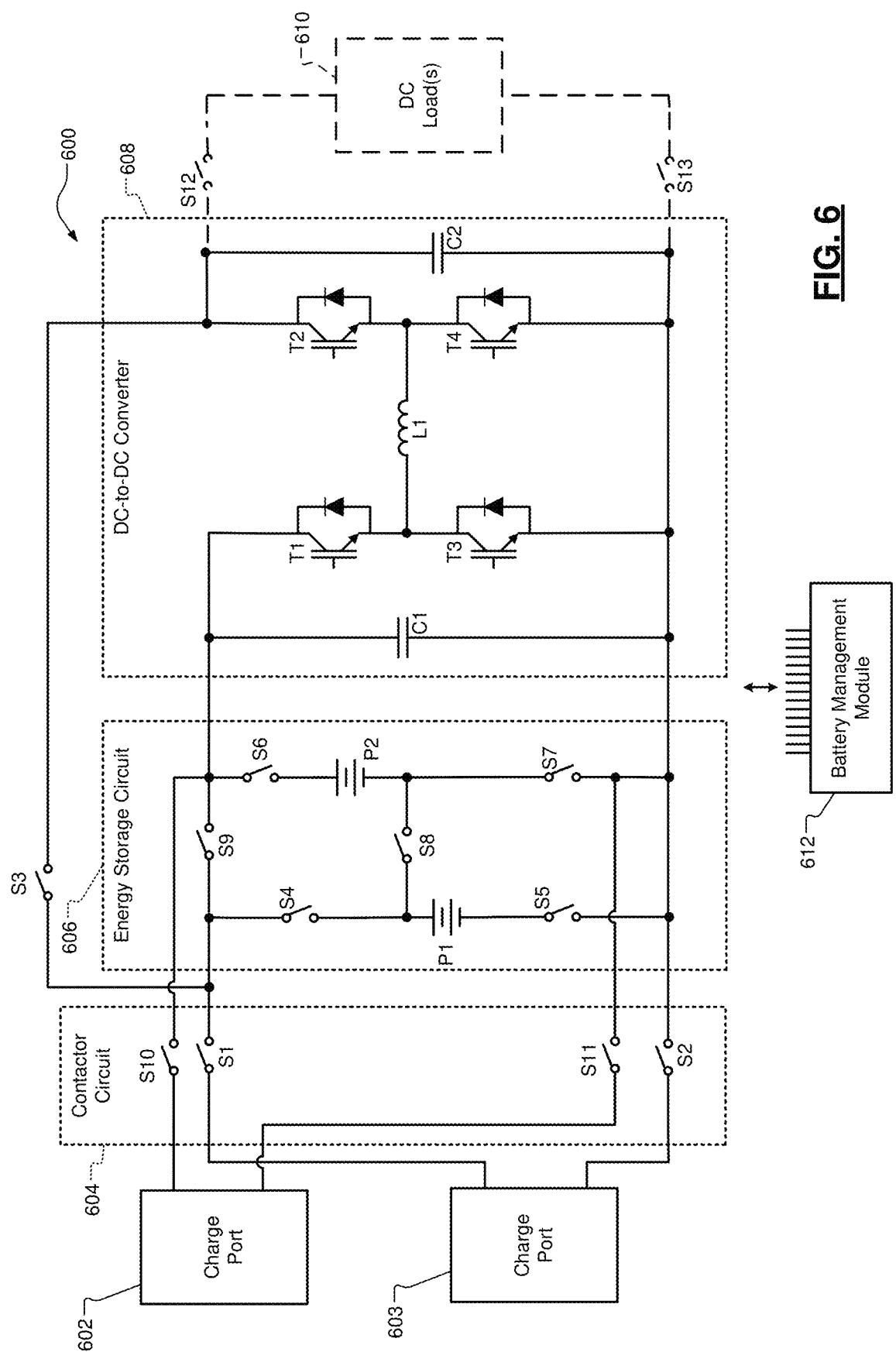
FIG. 6 is a schematic functional block diagram of a charging circuit configured for independent charging and/or charge balancing of battery packs via respective charge ports in accordance with the present disclosure.

FIG. 6 shows a charging circuit 600 configured for independent charging and/or charge balancing of battery packs P1, P2 via respective charge ports 602, 603. The charging circuit 600 also includes a contactor circuit 604, an energy storage circuit 606, and a DC-to-DC converter 608, which may be connected to one or more DC loads 610. The charge ports 602, 603 may be connected to a charging station, such as the charging station 204 of FIG. 2. The contactor circuit 604 may include switches S1, S2, S10, S11. The switches S1, S2, S10, S11 have first terminals connected to corresponding terminals of the charge port 602, 603.

The energy storage circuit 606 may include switches S4-S9 and battery packs P1 and P2. The switches S4 and S5 and the battery pack P1 are connected in series. The switches S6 and S7 and the battery pack P2 are connected in series. The switches S4 and S6 are connected to a second terminal of the switch S1 and a first terminal of switch S3. The switches S5 and S7 are connected to a second terminal of the switch S2. The switch S6 is connected to a second terminal of the switch S9. The switch S7 is connected to second terminals of the switches S2 and S11.

The switch S8 has a first terminal connected to the switch S4 and the battery pack P1. The switch S8 has a second terminal connected to the battery pack P2 and the switch S7. The switch S9 has a first terminal connected to the second terminal of the switch S1 and first terminals of the switches S3 and S4. The second terminal of the switch S9 is connected to the second terminal of the switch S10.

The DC-to-DC converter 608 may include capacitors C1 and C2, transistor-diode pairs T1-T4, and an inductor L1. The capacitor C1 is connected in parallel with the series combination of the switches S6, S7 and the battery pack P2. The transistor-diode pairs T1, T3 are connected in series and collectively in parallel with the capacitor C1. The transistor-diode pairs T2, T4 are connected in series and collectively in parallel with the capacitor C2. The transistor-diode pair T2 is connected to a second terminal of the switch S3. The transistor-diode pair T4 is connected to a second terminals of the switches S2 and S11.

A first terminal of the inductor L1 is connected to the transistor-diode pairs T1, T3. The second terminal of the inductor L1 is connected to the transistor-diode pairs T2, T4. The DC-to-DC converter 608 is bidirectional. In a first direction, terminals of the capacitor C1 and transistor-diode pairs T1, T3 operate as inputs and terminals of the capacitor C2 and transistor-diode pairs T2, T4 operate as outputs. In a second direction, terminals of the capacitor C1 and transistor-diode pairs T1, T3 operate as outputs and terminals of the capacitor C2 and transistor-diode pairs T2, T4 operate as inputs.

The DC loads 610 may be connected in parallel via switches S12, S13 to the series combination of the transistor-diode pairs T2, T4. The battery management module 612 or other control module disclosed herein may control states of the switches S1-S13 and the transistors of the transistor-diode pairs T1-T4, as described herein.

During operation, the battery packs P1 and P2 may be connected in series and the series combination thereof may be connected in parallel with the terminals of each of the charge ports 602, 603. For example, (i) switches S1 and S2 and/or S10 and S11 may be closed, (ii) switches S5, S6, S8 and S9 may be closed, and (iii) switches S3, S4 and S7 may be open. Switches S12 and S13 may be open during this period.

The battery packs P1 and P2 may also be connected individually to each of the charge ports 602, 603. For example, switches S4, S5, S9, S10 and S11 may be closed to connect the charge port 602 to the battery pack P1. The switches S6, S7, S10 and S11 may be closed to connect the charge port 602 to the battery pack P2. The switches S1, S2, S3 and S4 may be closed to connect the charge port 603 to the battery pack P1. The switches S1, S2, S6, S7 and S9 may be closed to connect the charge port 603 to the battery pack P2.

The battery packs P1 and P2 may also be connected in parallel and connected to the charge port 602 and/or 603. Switches S1, S2, S4, S5, S6, S7, S9 may be closed to connect the charge port 603 to the battery packs P1 and P2 connected in parallel. Switches S4, S5, S6, S7, S9, S10 and S11 may be closed to connect the charge port 602 to the battery packs P1 and P2 connected in parallel. Switches S1, S2, S4, S5, S6, S7, S9, S10 and S11 are closed when connecting both of the charge ports to the battery packs P1 and P2 connected in parallel. This state configuration allows for multi-port and/or independent charging of the battery packs P1, P2 via the charge ports 602, 603.

After series charging, multi-port charging, and/or isolated charging is completed, the one of the battery packs with a lower charge than the other one of the battery packs may be (i) charged by one or more of the charge ports 602, 603, or (ii) charged by the battery pack with the higher state of charge via the DC-to-DC converter 608.

The DC-to-DC converter 608 may be used to charge balance the battery packs P1, P2. The battery pack that has the lowest SOC and/or VOC may be charged by the other battery pack. For example, switches S1, S2, S8, S9, S10 and S11 are open and switches S3, S4, S5, S6 and S7 are closed. This disconnects the charge port 602, 603 and connects the first battery pack P1 to the transistor-diode pairs T2, T4 and the second battery pack P2 to the transistor-diode pairs T1 and T3.

The battery management module 612 may control duty cycles and/or frequencies of pulse width modulated (PWM) signals supplied to the transistors of the transistor-diode pairs T1-T4. The duty cycles and frequencies may be adjusted to adjust the output voltage of the DC-to-DC converter 608. This control may be provided based on monitored SOC, VOC and capacity states of the battery packs P1 and P2.

When the VOCs of the battery packs P1, P2 are within a predetermined range of each other, charge balancing is complete. After charge balancing, switches S1, S2, S3, S8, S10 and S11 are open and switches S4, S5, S6, S7, S9, S12 and S13 are closed, such that the battery packs P1 and P2 are connected in parallel and supplying power to the DC-to-DC converter 608, which is supplying power to the DC loads 610.

Figure 7:
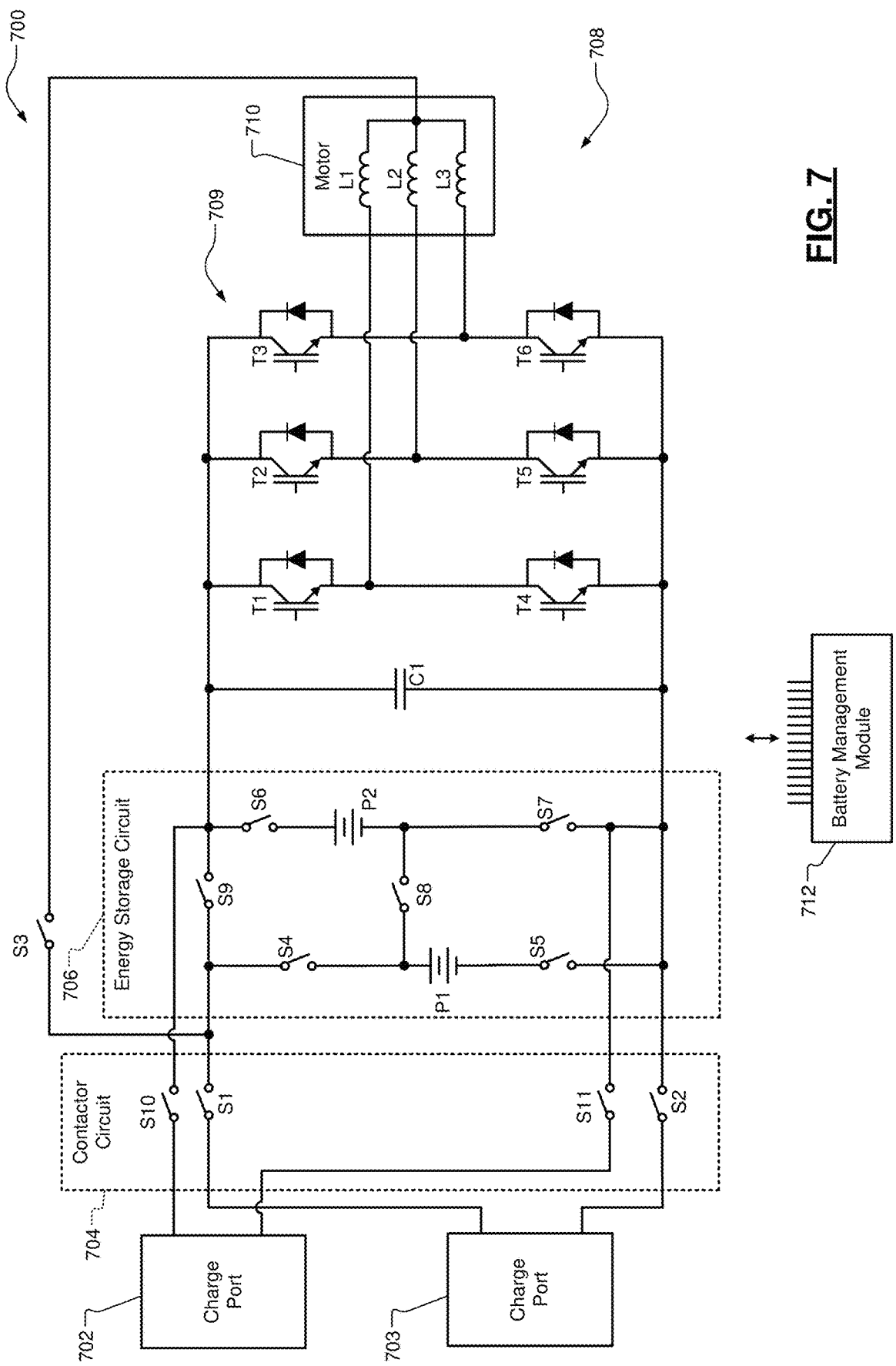
FIG. 7 is a schematic functional block diagram of a charging circuit configured for independent charging and/or charge balancing of battery packs via respective charge ports and a motor inverter circuit in accordance with the present disclosure.

FIG. 7 a charging circuit 700 configured for independent charging and/or charge balancing of battery packs P1 and P2 via respective charge ports 702, 703 and a motor inverter circuit 708. The charging circuit 700 also includes a contactor circuit 704, an energy storage circuit 706, and the motor inverter circuit 708. The charge ports 702, 703 may be connected to a charging station, such as the charging station 204 of FIG. 2. The contactor circuit 704 may include switches S1, S2, S10, S11. The switches S1, S2, S10, S11 have first terminals connected to corresponding terminals of the charge port 702, 703.

The energy storage circuit 706 may include switches S4-S9 and battery packs P1 and P2. The switches S4 and S5 and the battery pack P1 are connected in series. The switches S6 and S7 and the battery pack P2 are connected in series. The switches S4 and S6 are connected to a second terminal of the switch S1 and a first terminal of switch S3. The switches S5 and S7 are connected to a second terminal of the switch S2. The switch S6 is connected to a second terminal of the switch S9. The switch S7 is connected to second terminals of the switches S2 and S11.

The switch S8 has a first terminal connected to the switch S4 and the battery pack P1. The switch S8 has a second terminal connected to the battery pack P2 and the switch S7. The switch S9 has a first terminal connected to the second terminal of the switch S1 and first terminals of the switches S3 and S4. The second terminal of the switch S9 is connected to the second terminal of the switch S10.

The motor inverter circuit 708 includes a capacitor C1, an inverter 709 and a motor 710 including inductors (or coils) L1-L3. The inverter includes transistor-diode pairs T1-T6. The capacitor C1 is connected in parallel with the series combination of the switches S6, S7 and the battery pack P2. The transistor-diode pairs T1, T4 are connected in series and collectively in parallel with the capacitor C1. The transistor-diode pairs T2, T5 are connected in series and in parallel with the series combination of transistor-diode pairs T1, T4. The transistor-diode pairs T3, T6 are connected in series and in parallel with the series combination of transistor-diode pairs T1, T4 and the series combination of transistor-diode pairs T2, T5. The transistor-diode pairs T1, T2 and T3 are connected to second terminals of the switches S9 and S10 and to the first terminal of switch S6. The transistor-diode pairs T4, T5 and T6 are connected to a second terminals of the switches S2, S5, S7 and S11.

A first terminal of the inductor L1 is connected to the transistor-diode pairs T1 and T4 and a second terminal of the inductor L1 is connected to the second terminal of the switch S3. A first terminal of the inductor L2 is connected to the transistor-diode pairs T2 and T5 and a second terminal of the inductor L2 is connected to the second terminal of the switch S3. A first terminal of the inductor L3 is connected to the transistor-diode pairs T3 and T6 and a second terminal of the inductor L3 is connected to the second terminal of the switch S3.

Current flow through the motor inverter circuit 708 may be bidirectional. In a first direction, terminals of the capacitor and transistor-diode pairs T1-T6 operate as inputs and second terminals of the inductors L1-L3 operate as outputs. In a second direction, terminals of the capacitor and transistor-diode pairs T1-T6 operate as outputs and second terminals of the inductors L1-L3 operate as inputs.

The battery management module 712 or other control module disclosed herein may control states of the switches S1-S11 and the transistors of the transistor-diode pairs T1-T6, as described herein.

During operation, the battery packs P1 and P2 may be connected in series and the series combination thereof may be connected in parallel with the terminals of each of the charge ports 702, 703. For example, (i) switches S1 and S2 and/or S10 and S11 may be closed, (ii) switches S5, S6, S8 and S9 may be closed, and (iii) switches S3, S4 and S7 may be open. Switches S12 and S13 may be open during this period.

The battery packs P1 and P2 may also be connected individually to each of the charge ports 702, 703. For example, switches S4, S5, S9, S10 and S11 may be closed to connect the charge port 702 to the battery pack P1. The switches S6, S7, S10 and S11 may be closed to connect the charge port 702 to the battery pack P2. The switches S1, S2, S3 and S4 may be closed to connect the charge port 703 to the battery pack P1. The switches S1, S2, S6, S7 and S9 may be closed to connect the charge port 703 to the battery pack P2.

The battery packs P1 and P2 may also be connected in parallel and connected to the charge port 702 and/or 703. Switches S1, S2, S4, S5, S6, S7, S9 may be closed to connect the charge port 703 to the battery packs P1 and P2 connected in parallel. Switches S4, S5, S6, S7, S9, S10 and S11 may be closed to connect the charge port 702 to the battery packs P1 and P2 connected in parallel. Switches S1, S2, S4, S5, S6, S7, S9, S10 and S11 are closed when connecting both of the charge ports to the battery packs P1 and P2 connected in parallel. This state configuration allows for multi-port and/or independent charging of the battery packs P1, P2 via the charge ports 702, 703.

After series charging, multi-port charging, and/or isolated charging is completed, the one of the battery packs with a lower charge than the other one of the battery packs may be (i) charged by one or more of the charge ports 702, 703, (ii) charged by the battery pack with the higher state of charge via the motor inverter circuit 708, and/or (iii) via the motor inverter circuit 708, which may operate as a buck or boost converter to charge the battery pack with the lower VOC. When the battery pack P2 has a higher VOC and/or SOC, the battery pack P1 may be charged by one or more of the charge ports 702, 703 or by the battery pack P2. For example, the switches S1, S2, S6, S7, S8 and S9 may be open and the switches S3, S4, S5, S10 and S11 may be closed for charging the battery pack P1 via the motor inverter circuit 708. In this configuration, charge port 702 and the motor inverter circuit 708 are used to charge the battery pack P1. As another example, switches S1, S2, S8, S9, S10 and S11 are open and switches S3, S4, S5, S6 and S7 are closed, such that the battery pack P2 is charging the battery pack P1 via the motor inverter circuit 708.

The motor inverter circuit 708 may be used to charge balance the battery packs P1, P2. The battery pack that has the lowest SOC and/or VOC may be charged by the other battery pack. For example, switches S1, S2, S8, S9, S10 and S11 are open and switches S3, S4, S5, S6 and S7 are closed. This disconnects the charge port 702, 703 and connects the first battery pack P1 to the second terminals of the inductors L1-L3 of the motor 710 and the second battery pack P2 to the transistor-diode pairs T1-T6.

The battery management module 712 may control duty cycles and/or frequencies of pulse width modulated (PWM) signals supplied to the transistors of the transistor-diode pairs T1-T6. The duty cycles and frequencies may be adjusted to adjust the output voltage of the inverter 709 and thus the output voltage of the motor inverter circuit 708. This control may be provided based on monitored SOC, VOC and/or capacity states of the battery packs P1 and P2.

When the VOCs of the battery packs P1, P2 are within a predetermined range of each other, charge balancing is complete. After charge balancing, switches S1, S2, S3, S8, S10 and S11 are open and switches S4, S5, S6, S7 and S9 are closed, such that the battery packs P1 and P2 are connected in parallel and supplying power to the motor inverter circuit 708. The motor 710 may be used for propulsion purposes.

Figure 8:
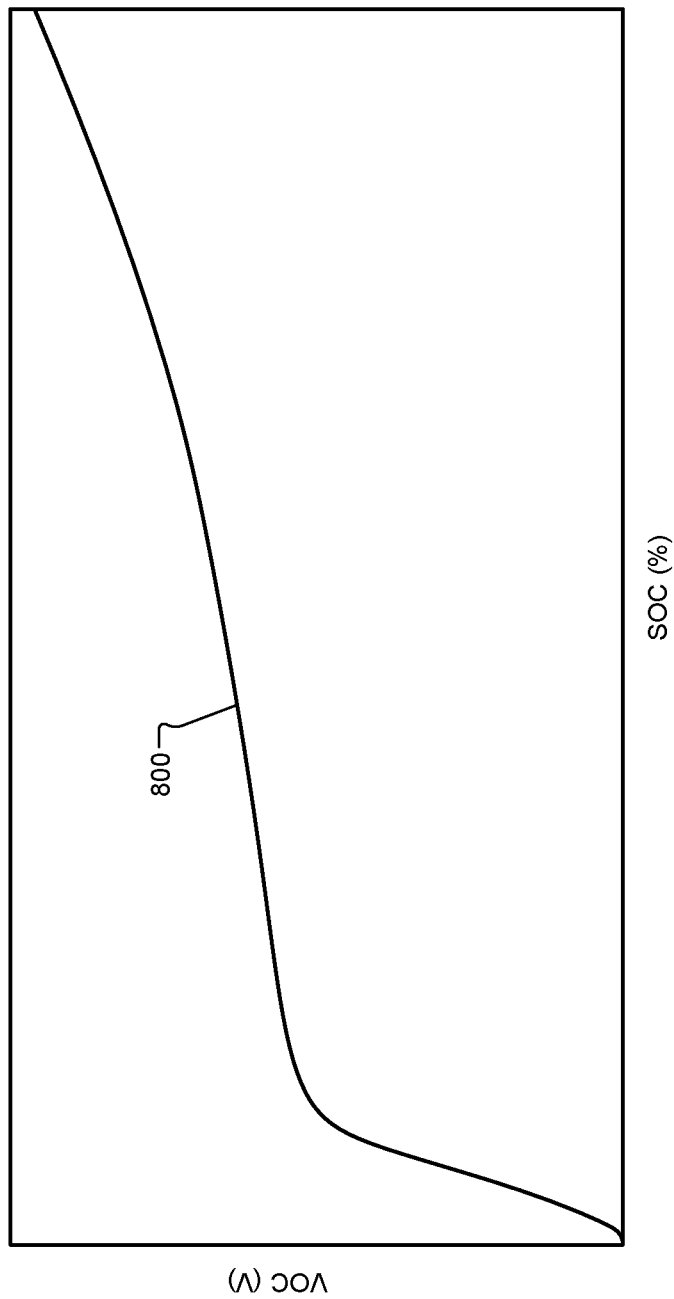
FIG. 8 is an example plot of open circuit voltage (VOC) versus state of charge (SOC) in accordance with the present disclosure.

FIG. 8 shows an example plot of an open circuit voltage (VOC) versus state of charge (SOC) curve 800. As the SOC increases, the VOC increases. This is not a linear relationship. A VOC of a battery pack, module, and/or cell may be calculated based on a SOC of that battery pack, module and/or cell. In one embodiment, when the vehicle control module 320 of FIG. 3 calculates VOCs of battery pack modules, a VOC versus SOC curve, such as the plot of FIG. 8 may be used. When the battery management module 340 of FIG. 3 calculates VOCs of the battery pack modules, each battery pack module calculate its own VOC based on a respective VOC versus SOC curve. A VOC of the corresponding battery pack may be set equal to a sum of the VOCs of the battery pack modules of that battery pack. Module based VOC calculation can improve the accuracy of determined VOCs.

When a battery pack has aged, a corresponding capacity of that battery pack is limited and as much the battery pack is referred to as being "weak". A weak battery pack stores less charge than a "strong" or "stronger" battery pack. A large in-rush current may be generated when the weak battery pack is connected in parallel with the strong battery pack. This can be true, even when the weak battery pack is fully charged. To overcome this issue, during charging, the VOC and/or SOC of the weak battery pack is monitored. High-voltage (e.g., 800V) series charging is stopped when the VOC and/or SOC of the weak battery pack reaches respective predetermined limits. As a couple of examples, the SOC limit may be 90% or 98%. One limit may be used, since the VOC and SOC of a battery pack are related.

A weak battery pack, which has a smaller capacity, typically charges quicker than a strong battery pack and typically has a higher VOC than the strong battery pack. If a battery pack is charged over defined SOC and VOC limits, then an unsafe and/or thermal runaway condition can arise. Since the weak battery pack is charged fully and/or charge to a VOC and/or SOC limit, then control as described herein prevents the strong battery pack from further charging the weak battery pack. This may be handled by, for example, either of the control modules 320, 340 of FIG. 3. The strong battery pack has room to accept some more charge. When the battery packs are connected in parallel, the battery packs balance out and the SOC of the weak battery pack decreases due to the charging of the strong battery pack via the weak battery pack. The SOC of the strong battery pack increases slightly due to this charging. The resulting SOCs of the battery packs are then within a safe operating range.

Figure 9:
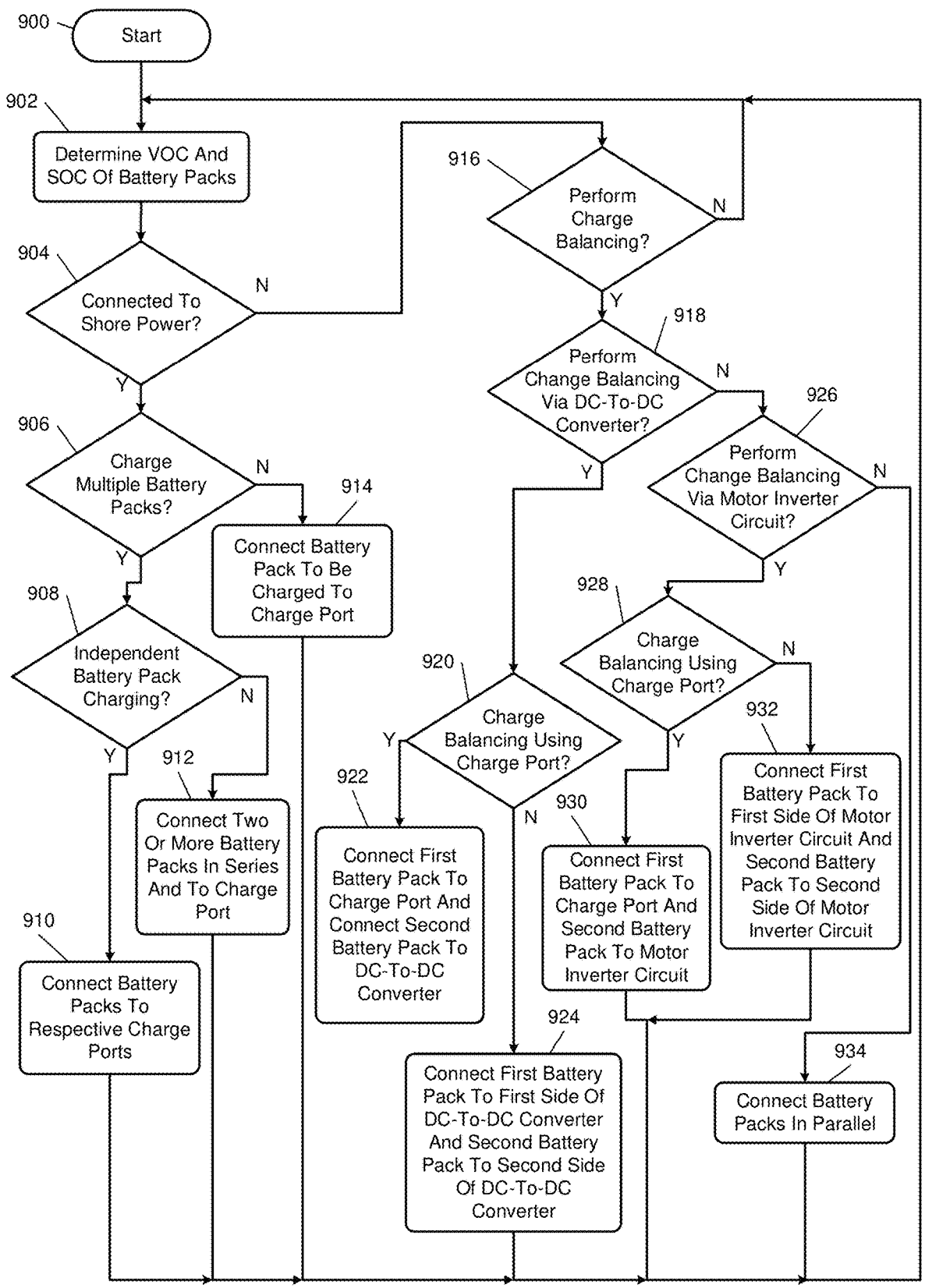
FIG. 9 illustrates an example charging method implemented by a control module or battery management module in accordance with the present disclosure.

FIG. 9 shows an example charging method implemented by a control module, such as the vehicle control module 320 or battery management module 340 of FIG. 3 or other control module disclosed herein. Although the following operations are primarily described with respect to the implementations of FIGS. 4-7, the operations may be easily modified to apply to other implementations of the present disclosure. The operations may be iteratively performed by one of the disclosed battery management modules. Also, although the following operations are primarily described with respect to the embodiments of FIGS. 4-7, the operations may be applied to application that include more than two battery packs.

The method may begin at 900. At 902, the control module may determine the VOCs, SOCs and/or capacities of battery packs (e.g., the battery packs of FIGS. 3-7) of a vehicle. This may be determined as described above. When the VOCs and/or SOCs are below predetermined thresholds, operation 904 may be performed. Operation 904 may be performed when the control module receives an indication and/or an instruction to initiate charging and/or charge balancing.

At 904, the control module may determine whether a charging circuit (e.g., one of the charging circuits of FIGS. 2-7) of the vehicle is connected to shore power (i.e., connected to a charging station). The control module may communicate with the charging station (e.g., the charging station 204 of FIG. 2) and/or other infrastructure device to determine charging parameters (e.g., voltage and/or current levels). If the charging circuit is connected to a charging station, operation 906 may be performed, otherwise operation 916 may be performed. Operations 906 and 916 may be performed for example when the charging circuit is connected to a charging station and the VOCs and/or SOCs of one or more of the battery packs are below predetermined maximum values.

At 906, the control module may determine whether multiple battery packs are to be charged. If yes, operation 908 may be performed, otherwise operation 914 may be performed.

At 908, the control module may determine whether independent battery pack charging is to be performed. If yes, operation 910 may be performed, otherwise operation 912 may be performed. At 910, the control module may connect the battery packs to respective charge ports, such as the charge ports of FIGS. 6-7. At 912, the control module may connect the battery packs in series and to one or more charge ports, such as any of the charge ports of FIGS. 4-7. At 914, the control module may connect the battery pack to be charged to one or more charge ports, such as any of the charge ports of FIGS. 4-7.

At 916, the control module may determine whether charge balancing is to be performed. If yes, operation 918 is performed, otherwise operation 902 may be performed. At 918, the control module may determine whether charge balancing is to be performed via a DC-to-DC converter (e.g., one of the DC-to-DC converters of FIGS. 4-6). If yes, operation 920 may be performed, otherwise operation 926 may be performed.

At 920, the control module may determine whether charge balancing using a charge port is to be performed. If yes, operation 922 may be performed, otherwise operation 924 may be performed. At 922, the control module may connect a first battery pack to a charge port and connect a second battery pack to the DC-to-DC converter, as described above. At 924, the control module may connect the first battery pack to first side (i.e., input or output) of DC-to-DC converter and second battery pack to second side (i.e., other one of the input and output) of DC-to-DC converter.

At 926, the control module may determine whether to perform charge balancing via a motor inverter circuit, such as the motor inverter circuit of FIG. 7. If yes, operation 928 may be performed, otherwise operation 934 may be performed.

At 928, the control module may determine whether charge balancing using a charge port is to be performed. If yes, operation 930 may be performed, otherwise operation 932 may be performed.

At 930, the control module may connect the first battery pack to one or more charge ports and the second battery pack to the motor inverter circuit. At 932, the control module may connect the first battery pack a first side of the motor inverter circuit and the second battery pack to a second side of the motor inverter circuit. At 934, the control module may connect the battery packs in parallel.

The above-described operations of FIG. 9 are meant to be illustrative examples. The operations may be performed sequentially, synchronously, simultaneously, continuously, during overlapping time periods or in a different order depending upon the application. Also, any of the operations may not be performed or may be skipped depending on the implementation and/or sequence of events.

The above-described examples include use of DC-to-DC converters and motor inverter circuit to charge balance the VOCs of battery packs. This charge balancing may be performed subsequent to series charging the battery packs. A first battery pack with a low VOC may be continuously charged until the VOC of the first battery pack is within a predetermined range of a VOC of at least one other battery pack and/or a difference between the two VOCs is less than a predetermine threshold. When the stated charge balancing is completed, and battery packs may be connected in parallel. The charging of the battery pack having the low VOC may be accomplished using one or more the above-stated charge ports to continuously charge the low VOC battery pack. As an alternative, a battery pack having a high VOC may be used to charge the battery pack having the low VOC.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A charging system comprising:
one or more charge ports configured to receive shore power from a charging station;
at least one of a direct current (DC)-to-DC converter or a motor inverter circuit;
a plurality of switches configured to connect a plurality of battery packs (i) to the charging station via the one or more charge ports and (ii) to the at least one of the DC-to-DC converter or the motor inverter circuit;
a control module configured to (i) determine at least one of open circuit voltages or states of charges of the plurality of battery packs, (ii) based on the at least one of the open circuit voltages or the states of charges of the plurality of battery packs, determine whether to connect at least one of the plurality of battery packs to the one or more charge ports, the DC-to-DC converter, and the motor inverter circuit, and (iii) based on the determination of whether to connect the at least one of the plurality of battery packs, control states of the plurality of switches to charge the at least one of the plurality of battery packs by selectively connecting the at least one of the plurality of battery packs to at least one of (a) the one or more charge ports, or (b) the at least one of the DC-to-DC converter or the motor inverter circuit; and
a contactor circuit connected between i) the one or more charge ports and ii) the plurality of battery packs and the DC-to-DC converter,
wherein
the plurality of battery packs comprise a first battery pack and a second battery pack,
the plurality of switches comprise a first switch, a second switch, a third switch, a fourth switch, and a fifth switch,
the first switch is connected between the contactor circuit and the first battery pack,
the second switch connected between the first battery pack and the contactor circuit,
the third switch is connected between the contactor circuit and the second battery pack,
the fourth switch is connected between the second battery pack and the contactor circuit, and
the fifth switch is connected between i) the first switch and the first battery pack and ii) the second battery pack and the fourth switch.

2. The charging system of claim 1, further comprising a plurality of sensors configured to detect the open circuit voltages of the plurality of battery packs.

3. The charging system of claim 1, wherein:
the plurality of switches are configured to connect the one or more charge ports to the plurality of battery packs; and
the control module is configured to, based on the at least one of the open circuit voltages or the states of charges of the plurality of battery packs, control the states of the plurality of switches to charge at least one of the plurality of battery packs by selectively connecting the at least one of the plurality of battery packs to the one or more charge ports.

4. The charging system of claim 1, wherein:
the charging system comprises the DC-to-DC converter;
the plurality of switches are configured to connect the one or more charge ports and the DC-to-DC converter to the plurality of battery packs; and
the control module is configured, based on the at least one of the open circuit voltages or the states of charges of the plurality of battery packs, to control the states of the plurality of switches to charge the at least one of the plurality of battery packs by selectively connecting the at least one of the plurality of battery packs to the DC-to-DC converter.

5. The charging system of claim 4, wherein the control module is configured to control the states of the plurality of switches to charge a selected one or more of the plurality of battery packs via the one or more charge ports and the DC-to-DC converter.

6. The charging system of claim 1, wherein:
the plurality of switches are configured to connect the motor inverter circuit to the plurality of battery packs; and
the control module is configured to, based on the at least one of the open circuit voltages or the states of charges of the plurality of battery packs, control the states of the plurality of switches to charge at least one of the plurality of battery packs by selectively connecting the at least one of the plurality of battery packs to the motor inverter circuit.

7. The charging system of claim 6, wherein the control module is configured to control the states of the plurality of switches to charge a selected one or more of the plurality of battery packs via the one or more charge ports and the motor inverter circuit.

8. The charging system of claim 6, wherein the motor inverter circuit comprises:
an inverter; and
a motor configured to receive power from the plurality of battery packs or the one or more charge ports via the inverter.

9. The charging system of claim 1, wherein the control module is configured to:
control the states of the plurality of switches to connect (i) the plurality of battery packs in series and to terminals of the one or more charge ports; and
change the states of the plurality of switches to connect the one or more charge ports to an input of the DC-to-DC converter, and (ii) an output of the DC-to-DC converter to one or more of the plurality of battery packs.

10. The charging system of claim 1, wherein the control module is configured to control the states of the plurality of switches to (i) connect the first battery pack to an input of the DC-to-DC converter, and (ii) an output of the DC-to-DC converter to the second battery pack to perform charge balancing via the DC-to-DC converter.

11. The charging system of claim 1, wherein:
the one or more charge ports comprise a plurality of charge ports;
each of the plurality of charge ports are configured to be connected to each of the plurality of battery packs based on states of the plurality of switches; and
the control module is configured to independently charge each of the plurality of battery packs with one or more of the plurality of charge ports.

12. The charging system of claim 1, wherein the control module is configured to:
control the states of the plurality of switches to series charge the plurality of battery packs; and
subsequent to series charging the plurality of battery packs, cease charging of a first one of the plurality of battery packs and continue charging of a second one of the battery packs until an open circuit voltage of the second one of the plurality of battery packs is within a predetermined range of an open circuit voltage of the first one of the plurality of battery packs.

13. The charging system of claim 12, wherein the charging of the second one of the plurality of battery packs is performed via the at least one of the DC-to-DC converter or the motor inverter circuit.

14. The charging system of claim 13, wherein subsequent to charging the second one of the plurality of battery packs, the control module is configured to control states of the plurality of switches to connect the plurality of battery packs in parallel.

15. The charging system of claim 1, wherein the control module is configured to calculate an open circuit voltage of one of the plurality of battery packs based on open circuit voltages of a plurality of modules of the one of the plurality of battery packs.

16. The charging system of claim 1, wherein the control module is configured to subsequent to series charging the plurality of battery packs, determine a first one of the plurality of battery packs has a lower capacity and a higher open circuit voltage than a second one of the plurality of battery packs, and charge the second one of the plurality of battery packs via the first one of the plurality of battery packs.

17. The charging system of claim 1, wherein the charging of the second one of the plurality of battery packs is performed via the at least one of the DC-to-DC converter or the motor inverter circuit.

18. The charging system of claim 1, wherein the control module is configured, subsequent to the charging of at least one of the plurality of battery packs, to at least one of:
control the states of the plurality of switches to (i) connect the plurality of battery packs in parallel and to an input of the DC-to-DC converter, and (ii) connect an output of the DC-to-DC converter to a load; or
control the states of the plurality of switches to connect the plurality of battery packs in parallel and to an input of the motor inverter circuit to drive a motor of the motor inverter circuit.

19. The charging system of claim 1, wherein the control module is configured to (i) determine the open circuit voltages of the plurality of battery packs, (ii) based on the open circuit voltages of the plurality of battery packs, determine whether to connect the at least one of the plurality of battery packs to the one or more charge ports, the DC-to-DC converter, and the motor inverter circuit, and (iii) based on the determination of whether to connect the at least one of the plurality of battery packs to the one or more charge ports, the DC-to-DC converter, and the motor inverter circuit, control states of the plurality of switches to charge the at least one of the plurality of battery packs by selectively connecting the at least one of the plurality of battery packs to at least one of (a) the one or more charge ports and (b) the DC-to-DC converter or the motor inverter circuit.

20. The charging system of claim 1, further comprising a sixth switch configured to bypass the plurality of switches and the DC-to-DC converter and connect the one or more charge ports to one or more loads.

21. The charging system of claim 1, wherein:
the one or more charge ports comprise a plurality of charge ports; and
the contact circuit is configured to independently connect each of the plurality of charge ports to each of the plurality of battery packs and the DC-to-DC converter.

* * * * *